(12) United States Patent
Nakajima

(10) Patent No.: US 7,629,651 B2
(45) Date of Patent: Dec. 8, 2009

(54) SEMICONDUCTOR MEMORY DEVICE AND MANUFACTURING METHOD THEREFOR

(75) Inventor: Hiroomi Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 11/760,401

(22) Filed: Jun. 8, 2007

(65) Prior Publication Data

US 2007/0296014 A1 Dec. 27, 2007

(30) Foreign Application Priority Data

Jun. 27, 2006 (JP) ............................. 2006-177009

(51) Int. Cl.
*H01L 27/01* (2006.01)
*H01L 27/12* (2006.01)
*H01L 31/0392* (2006.01)

(52) U.S. Cl. ...................... 257/347; 257/354

(58) Field of Classification Search ......... 257/345–347, 257/E27.112, E29.147
See application file for complete search history.

(56) References Cited

U.S. PATENT DOCUMENTS

| 6,888,199 B2 * | 5/2005 | Nowak et al. ............... 257/347 |
| 7,049,654 B2 | 5/2006 | Chang |
| 7,166,895 B2 * | 1/2007 | Saito ........................ 257/347 |
| 7,187,046 B2 * | 3/2007 | Wu et al. .................... 257/347 |
| 7,564,081 B2 * | 7/2009 | Zhu et al. ................... 257/347 |
| 2008/0212366 A1* | 9/2008 | Ohsawa ...................... 365/182 |

OTHER PUBLICATIONS

U.S. Appl. No. 11/563,889, filed Nov. 28, 2006, Hiroomi Nakajima.
T. Tanaka, et al., "Scalability Study on a Capacitorless 1T-DRAM: From Single-gate PD-SOI to Double-gate FinDRAM", IEDM Tech. Dig., 2004, 4 Pages.
Takashi Ohsawa, et al., "Memory Design Using a One-Transistor Gain Cell on SOI", IEEE Journal of Solid-State Circuits, vol. 37, No. 11, Nov. 2002, pp. 1510-1522.

* cited by examiner

*Primary Examiner*—Cuong Q Nguyen
(74) *Attorney, Agent, or Firm*—Oblon, Spivak, McClelland, Maier & Neustadt, L.L.P.

(57) ABSTRACT

This disclosure concerns a semiconductor memory comprising Fin-type semiconductor layers (Fins) provided on the insulation layer provided on a substrate; first gate insulation films provided on first side surfaces of the Fins; second gate insulation films provided on second side surfaces of the Fins, the second side surfaces being opposite sides of the first side surfaces of the Fins; front gate electrodes provided on the first side surfaces via the first gate insulation films; and back gate electrodes provided between a second side surface of one of the Fins and a second side surface of the other Fin which is adjacent to the one of the Fins, the second side surface of the one of the Fins is opposed to the second side surface of the other Fin, wherein widths of the front gate electrodes or the back gate electrodes are smaller than the feature size (F).

7 Claims, 14 Drawing Sheets

41: FIRST GATE INSULATING FILM
42: SECOND GATE INSULATING FILM

SEMICONDUCTOR MEMORY DEVICE AND MANUFACTURING METHOD THEREFOR

CROSS-REFERENCE TO RELATED APPLICATION

This application is based upon and claims the benefit of priority from the prior Japanese Patent Applications No. 2006-177009, filed on Jun. 27, 2006, the entire contents of which are incorporated herein by reference.

BACKGROUND OF THE INVENTION

1. Field of the Invention

The present invention relates to a semiconductor memory device and a manufacturing method of a semiconductor memory device, e.g., a fin-type FBC (Floating Body Cell) memory.

2. Related Art

Development of technology for manufacturing full-depletion FBC ("FD-FBCs") on an SOI substrate has been underway. Each of the FD-FBCs includes a back gate to increase the signal difference (potential difference) between data "0" and "1". A thickness of a buried oxide film (BOX) layer is preferably smaller (for example, 25 nm or less) for the back gate to facilitate controlling body bias.

Nevertheless, the thickness of the BOX film is generally about 150 nm and it is technically difficult to make the thickness of the BOX layer equal to or smaller than 50 nm. To tackle the problem, a technique using a FinFET as an FBC has been developed. If the FinFET is used as the FBC, a thin gate insulating film can be formed on each side surface of a Fin (i.e., the FinFET). Therefore, the signal difference (potential difference) between the data "0" and the data "1" can be increased. In this case, the thickness of the BOX layer has no effect on characteristics of the FBC.

In a conventional FBC constituted by the FinFET, a silicon part provided between two front gates is present. Because this silicon part is not electrically activated, the silicon part does not contribute to FBC operations. An area of the silicon part occupies 30% or more of that of a memory region, so that the silicon part obstructs downsizing of a semiconductor memory device.

SUMMARY OF THE INVENTION

A semiconductor memory device according to am embodiment of the present invention comprises a semiconductor substrate; an insulation layer provided on the semiconductor substrate; a plurality of Fin-type semiconductor layers provided on the insulation layer, the Fin-type semiconductor layers including source regions, drain regions, and floating body regions in an electrically floating state provided between the source regions and the drain regions; first gate insulation films provided on first side surfaces of the Fin-type semiconductor layers; second gate insulation films provided on second side surfaces of the Fin-type semiconductor layers, the second side surfaces being opposite sides of the first side surfaces of the Fin-type semiconductor layers; front gate electrodes provided on the first side surfaces via the first gate insulation films; and back gate electrodes provided between a second side surface of one of the Fin-type semiconductor layers and a second side surface of the other Fin-type semiconductor layer which is adjacent to the one of the Fin-type semiconductor layers, the second side surface of the one of the Fin-type semiconductor layers and the second side surface of the other Fin-type semiconductor layer are opposed to each other, wherein when a smallest line width which can be formed by lithography is F, widths of the front gate electrodes or widths of the back gate electrodes are smaller than the F in a cross section perpendicular to an extension direction of the Fin-type semiconductor layers.

A method of manufacturing a semiconductor memory device according to am embodiment of the present invention comprises preparing a substrate including a semiconductor layer formed on a semiconductor substrate via an insulation film; forming a mask material covering an active area on the semiconductor layer; etching an element isolation area of the semiconductor layer using the mask material to form a first trench; filling the first trench with a dummy insulation film; removing the mask material; forming a first spacer on side surfaces of the dummy insulation film exposed by removing the mask material; forming a second trench in the active area using the first spacer as a mask; forming the first trench again by removing the dummy insulation film; forming a first gate insulation film and a second gate insulation film on side surfaces of a Fin-type semiconductor layer defined by the first trench and the second trench; and filling the first trench and the second trench with a polysilicon as a front gate electrode material and a back gate electrode material, respectively.

DETAILED DESCRIPTION OF THE INVENTION

Embodiments of the present invention will be explained below with reference to the accompanying drawings. The present invention is not limited to the embodiments.

First Embodiment

Figure 1:
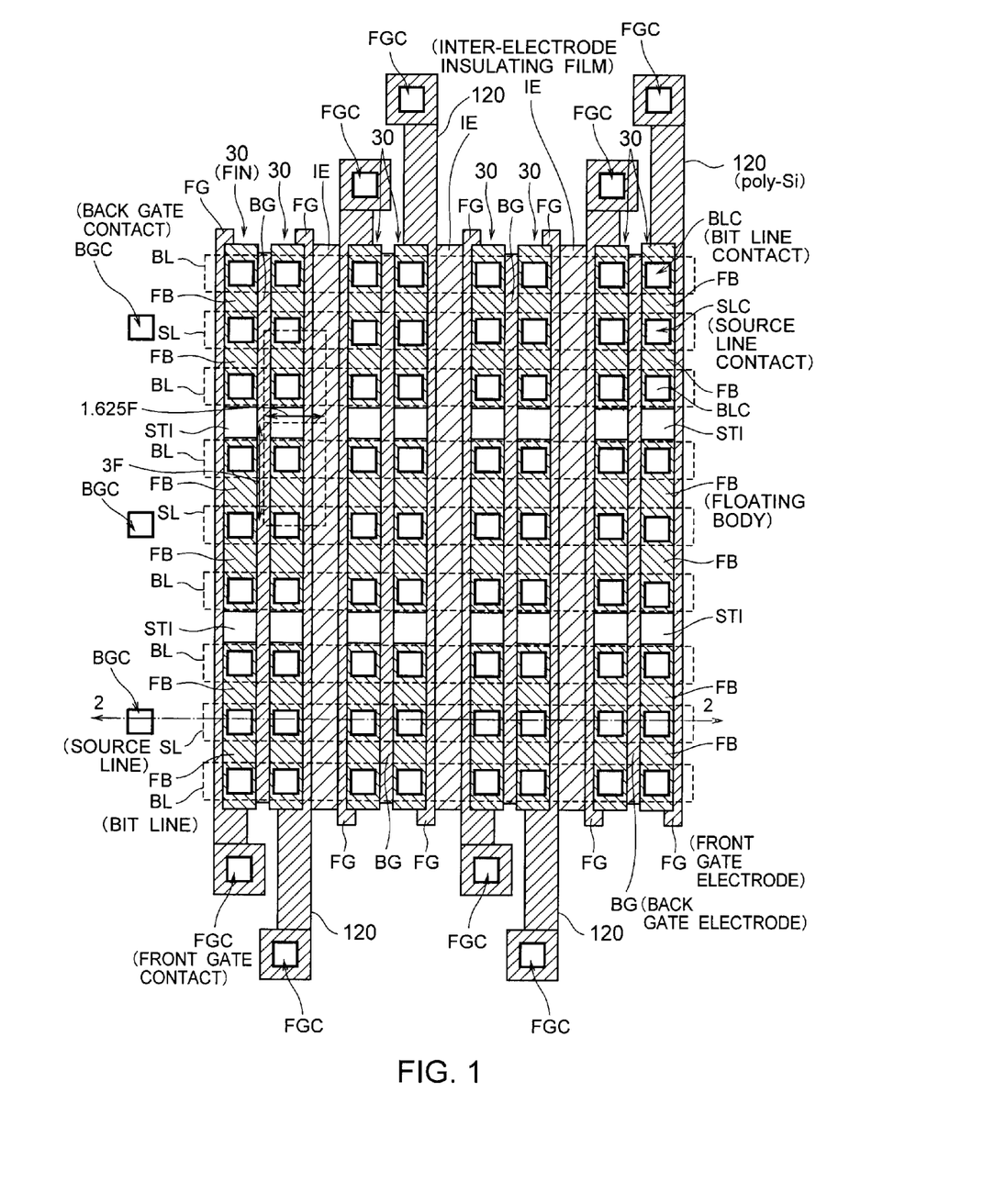
FIG. 1 is a schematic plan view of a Fin FBC memory device according to a first embodiment of the present invention.

FIG. 1 is a schematic plan view of a Fin FBC memory device according to a first embodiment of the present invention. The Fin FBC memory device is formed on an SOI (silicon-on-insulator) substrate. Each FBC can store therein data "1" or "1" according to the number of majority carries accumulated in a floating body FB (hereinafter, "body FB") provided between a source and a drain. The source, the drain, and the body FB are formed in an SOI layer.

In the FBC memory device according to the first embodiment, one source line SL is shared between two bit lines BLs. The bit lines BLs are connected to drains (not shown) present under the bit lines BLs via bit line contacts BLCs. Source lines SLs are connected to sources (see FIG. 2) present under the source lines SLs via source line contacts SLCs. An STI (Shallow Trench Isolation) that acts as an element isolation is formed between two adjacent bit lines BLs.

Front gate electrodes FGs and back gate electrodes BGs extend to be orthogonal to the source lines SL and the bit lines BLs formed on the SOI layer, and buried between adjacent bodies FBs. The front gate electrodes FGs are connected to front gate contacts FGCs. The back gate electrodes GBs are connected to back gate contacts BGCs provided outside of a memory formation region via the silicon substrate.

An inter-electrode insulating film IE is buried between two adjacent front gate electrodes FG.

Figure 2:
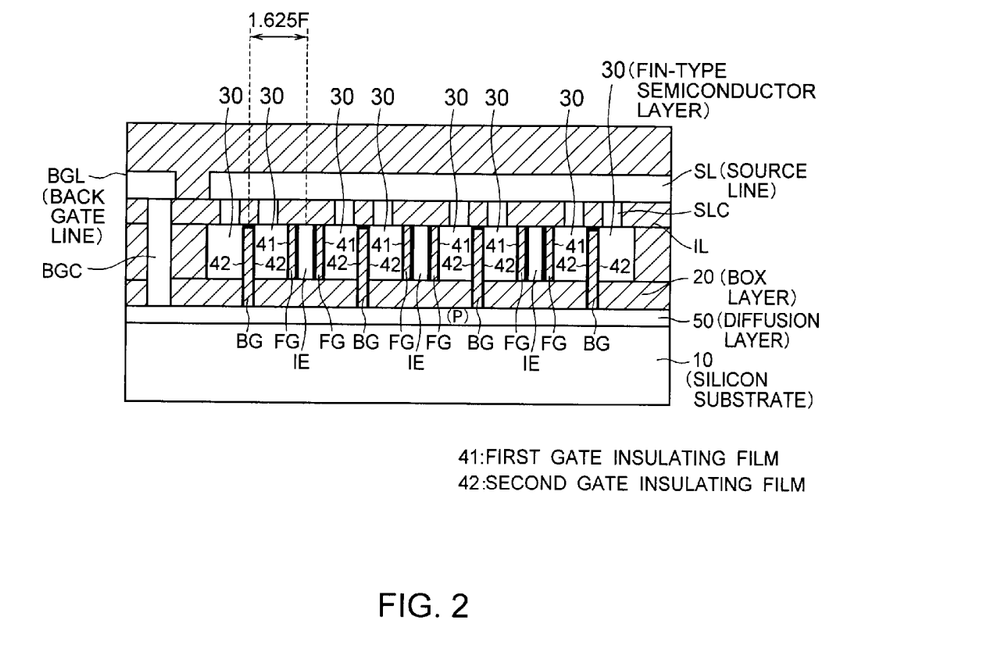
FIG. 2 is a cross-sectional view taken along a line 2-2 of FIG. 1.

FIG. 2 is a cross-sectional view taken along a line 2-2 of FIG. 1. The FBC memory device according to the first embodiment includes a silicon substrate 10, a BOX layer 20 provided on the silicon substrate 10, and Fin-type semiconductor layers 30 (hereinafter, "semiconductor layers") 30 provided on the BOX layer 20. The semiconductor layers 30 are formed using the SOI layer of the SOI substrate. The body FB and source-drain regions provided between respective both sides of the body FB are provided in the semiconductor layer 30. In FIG. 2, only the source region is shown. Because the cross section of the drain region is the same as that of the source region, the drain region is not shown in FIG. 2. Furthermore, the cross section of the body FB is the same as the cross section of FIG. 2 except that the source line SL, the source line contacts SLCs, the back gate contact BGC, and a back gate line BGL are removed from the cross section of FIG. 2. Therefore, the cross section of the body FB can be easily estimated from FIG. 2, and it is not shown in FIG. 2.

A first gate insulating film 41 is formed on one side surface (a first side surface) of each of the semiconductor layers 30. A second gate insulating film 42 is formed on the other side surface (a second side surface) of each of the semiconductor layers 30. The front gate electrodes FGs are provided on the first side surfaces of the semiconductor layers 30 via the first gate insulating films 41, respectively. The inter-electrode insulating film IE is provided between the two adjacent front gate electrodes FG. Namely, the inter-electrode insulating film IE is provided between the two front gate electrodes FG opposed to each other between the first side surface of one semiconductor layer 30 and that of another semiconductor layer 30 adjacent to the former semiconductor layer 30.

The back gate electrodes BGs are provided on the second side surfaces of the semiconductor layers 30 via the second gate insulating films 42, respectively. Each back gate electrode BG is provided between the second side surfaces of the two adjacent semiconductor layers 30. The back gate electrodes BGs penetrate the BOX layer 20 and reach the silicon substrate 10. An impurity diffusion layer 50 is provided on a surface of the silicon substrate 10. The back gate electrodes BGs are connected to the back gate contacts BGCs via the impurity diffusion layer 50. Accordingly, potentials of the back gate electrodes BGs can be controlled by controlling a potential of the back gate line BGL.

Figure 3:
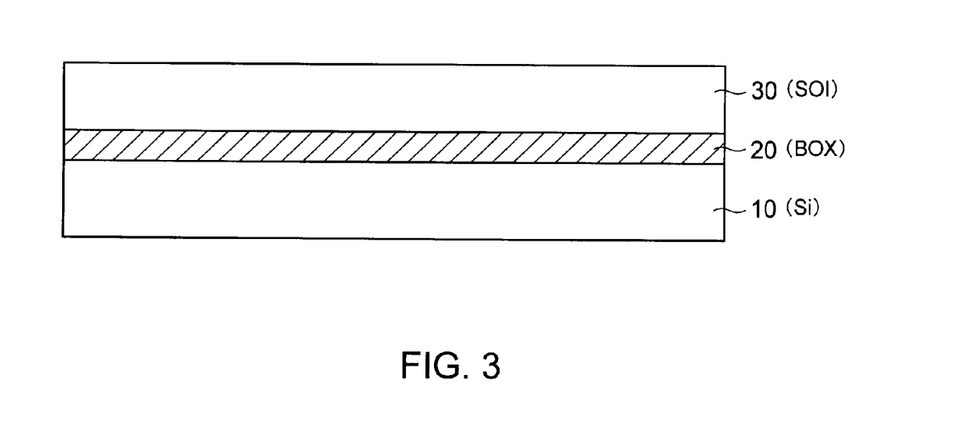
FIG. 3 is a cross-sectional view showing a method of manufacturing the Fin FBC memory device according to the first embodiment.
Figure 4:
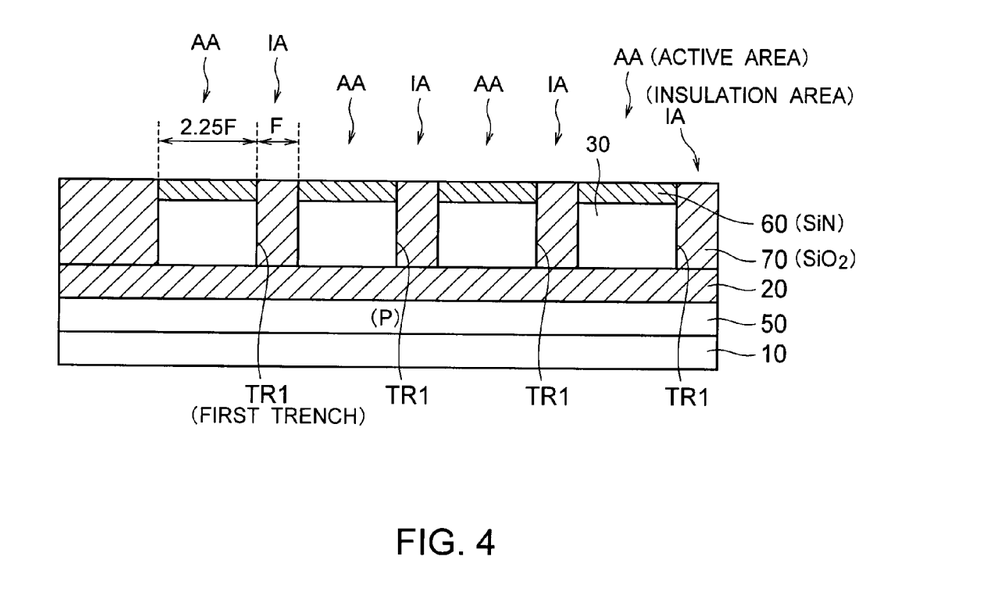
FIG. 4 is a cross-sectional view showing a manufacturing method following FIG. 3.

FIGS. 3 and 4 are cross-sectional views showing a method of manufacturing the Fin FBC memory device according to the first embodiment. The cross-sectional views of FIGS. 3 and 4 are along one source line SL. As shown in FIG. 3, an SOI substrate is prepared. The SOI substrate includes the semiconductor layer 30 provided on the silicon substrate 10 via the BOX layer 20. A thickness of the semiconductor layer 30 is, for example, about 100 nm. The semiconductor layer 30 is made of P-type silicon having a concentration of, for example, about $1 \times 10^{17}$ cm$^{-3}$. The semiconductor layer 30 can be used as an N-type MIS channel region as it is. A thickness of the BOX layer 20 is, for example, about 200 nm. The silicon substrate 10 may have a desired thickness and a desired impurity concentration.

Boron ions are implanted into a memory region in the SOI substrate, thereby forming a P-type impurity layer 50 in a surface region of the silicon substrate 10. At the time of implantation, implantation energy is about 130 keV and an impurity concentration is about $8 \times 10^{13}$ cm$^{-2}$. Next, a silicon nitride film 60 serving as a mask material is deposited on the semiconductor layer 30. The silicon nitride film 60 on element isolation areas IAs is removed by photolithography and RIE (Reactive Ion Etching). A hard mask covering each active area AA is thereby formed.

Using the silicon nitride film 60 as a mask, the semiconductor layer 30 in the element isolation areas IAs is anisotropically etched by photolithography and RIE. First trenches TR1 are thereby formed in the respective element isolation areas IAs. The semiconductor layer 30 between the two adjacent element isolation areas IA acts as the active area AA. At this time, a width of each element isolation area IA is F (Feature Size) and a width of the active area AA is 2.25 F. The F (Feature Size) means a minimum line width that can be formed by photolithography and etching. Accordingly, line widths that can be formed by the photolithography and the etching are all equal to or larger than F. However, if a spacer is used as a mask, line widths smaller than the F can be realized. Next, a silicon oxide film 70 serving as a dummy insulating film is filled up into each of the first trenches TR1 formed in the element isolation areas IA, thereby obtaining a structure shown in FIG. 4. The silicon oxide film 70 is not left as the STI because it is removed at a later step.

Figure 5:
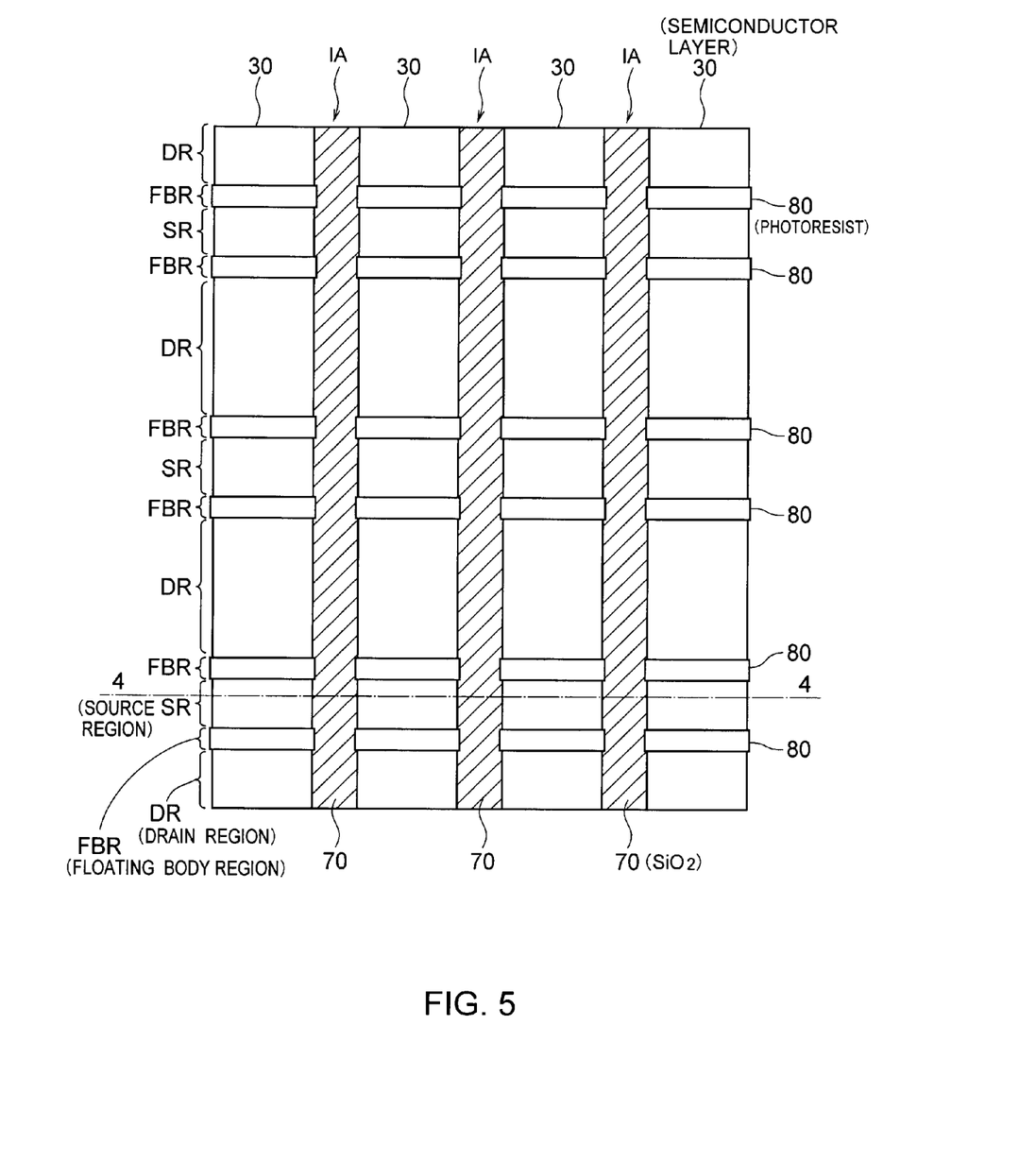
FIG. 5 is a plane view showing a manufacturing method following FIG. 4.

The silicon nitride film 60 is then removed using a hot phosphoric acid solution. Upper side surfaces of the silicon oxide film 70 are thereby exposed. Further, as shown in FIG. 5, a photoresist 80 covers body regions FBR by using photolithography. N-type impurity ions are then implanted into source regions SR and drain regions DR. At the time of implantation, a concentration of N-type impurities is about $1 \times 10^{21}$ cm$^{-3}$. FIG. 5 is a plan view at a source-drain forming step.

Figure 6:
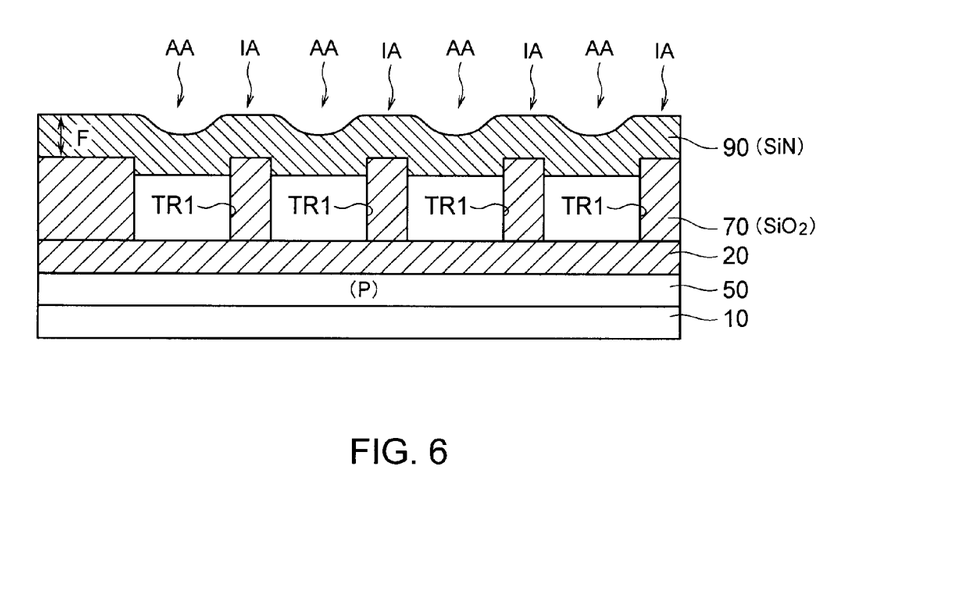
FIG. 6 is a cross-sectional view showing a manufacturing method following FIG. 5.
Figure 7:
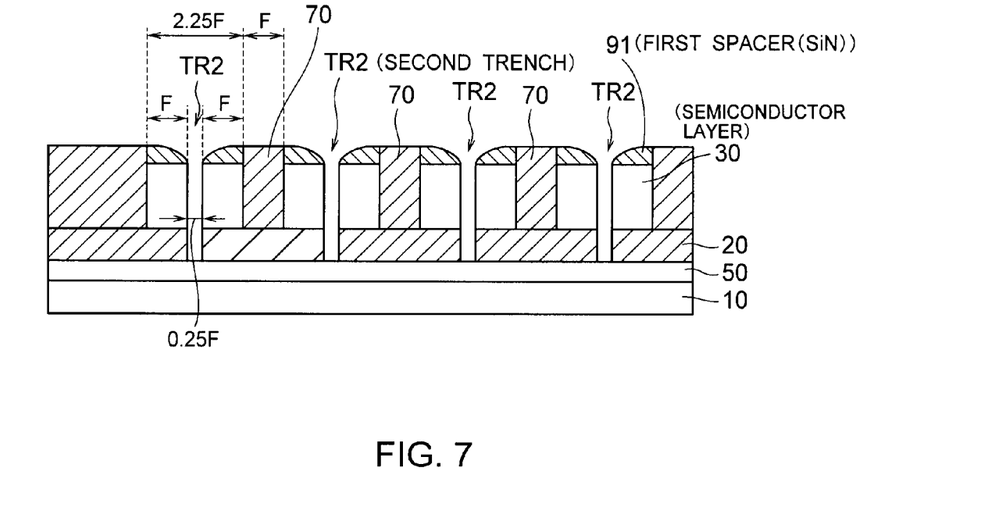
FIG. 7 is a cross-sectional view showing a manufacturing method following FIG. 6.
Figure 8:
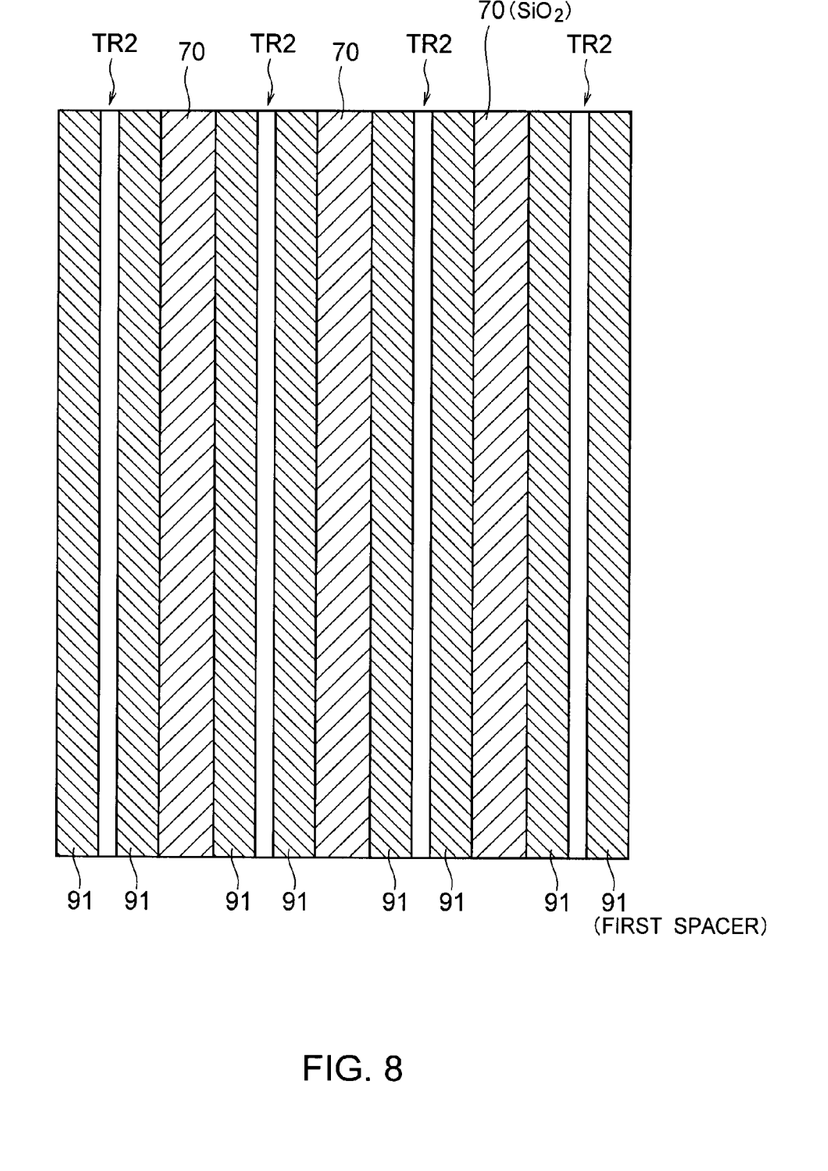
FIG. 8 is a plane view showing a manufacturing method following FIG. 7.
Figure 9:
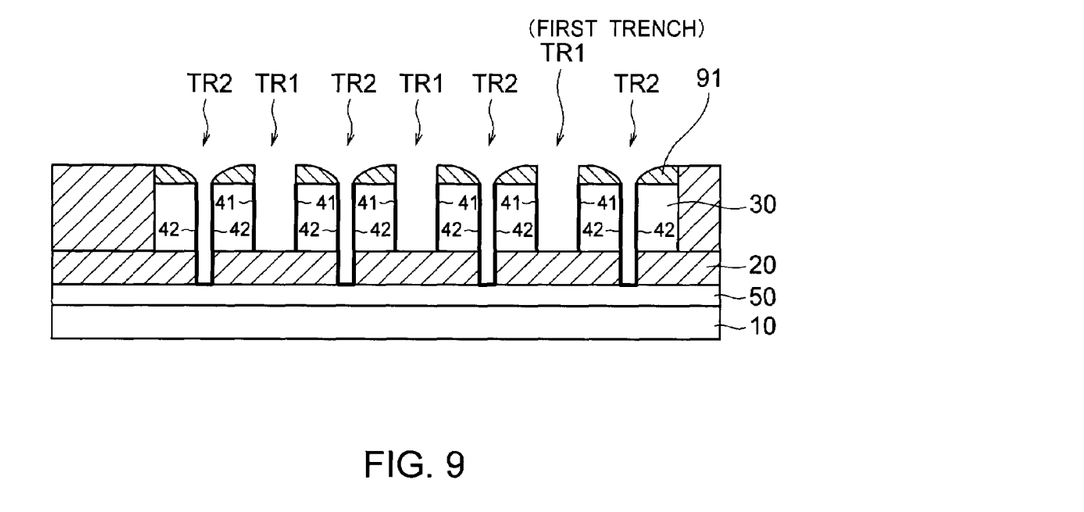
FIG. 9 is a cross-sectional view showing a manufacturing method following FIG. 8.

After removing the photoresist 80 as shown in FIG. 6, a silicon nitride film 90 having a thickness of F is deposited and then the silicon nitride film 90 is anisotropically etched by the RIE. As a result, as shown in FIG. 7, first spacers 91 are formed on side surfaces of the silicon oxide film 70 exposed by removing the silicon nitride film 60, respectively. A width of each of the first spacers 91 is about F. Accordingly, an upper surface of the semiconductor layer 30 is exposed by as much width as 0.25 F. Moreover, using the first spacers 91 as a mask, the semiconductor layer 30 and the BOX layer 20 are etched in a self-aligned fashion by the RIE. As a result, the semiconductor layer 30 is isolated into a plurality of semiconductor layers 30 and a second trench TR2 is formed in an intermediate portions between two adjacent semiconductor layers 30. The second trenches TR2 reach the impurity diffusion layer 50 formed on the surface of the semiconductor substrate 10. At this time, each of the isolated semiconductor layers 30 is formed into a fine Fin. FIG. 8 is a plan view showing a structure after forming the second trenches R2. As shown in FIG. 8, the second trenches TR2 extend along the first spacers 91 and the silicon oxide film (dummy insulating film) 70. Accordingly, the second trenches TR2 isolate the semiconductor layer 30 into a plurality of Fins.

As shown in FIG. 8, the silicon oxide film 70 filled up into the element isolation areas IA is removed by photolithography and etching. As a result, first trenches TR1 are formed in the respective element isolation areas IA again. The semiconductor layer 30 is exposed on inner side surfaces of the first and second trenches TR1 and TR2. A sidewall of the exposed semiconductor layer 30 is thermally oxidized. The first insulating film 41 and the second insulating film 42 are thereby formed on the respective side surfaces of the semiconductor layer 30. Thicknesses of the first and second gate insulating films 41 and 42 are about 6 nm, respectively.

Figure 10:
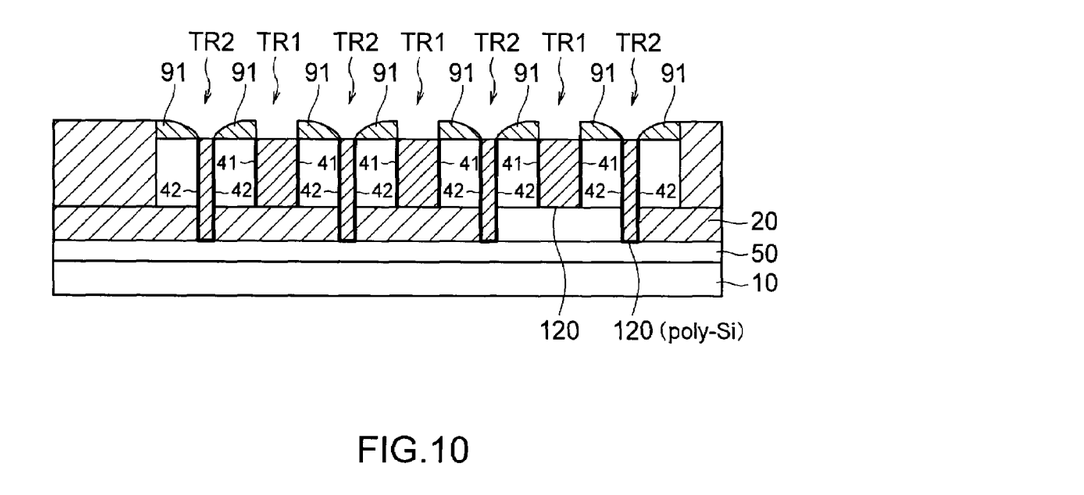
FIG. 10 is a cross-sectional view showing a manufacturing method following FIG. 9.

Next, a silicon oxide film on the silicon substrate 10 and on bottoms of the second trenches TR2 formed at the time of forming the gate insulating films 41 and 42 is removed. As shown in FIG. 10, an N-type polysilicon 120 is filled up into the first and second trenches TR1 and TR2. The polysilicon 120 is planarized by CDE (Chemical Dry Etching). The polysilicon 120 serves as materials of the front gate electrodes FG and the back gate electrodes BG in the first and second trenches TR1 and TR2, respectively.

Figure 11:
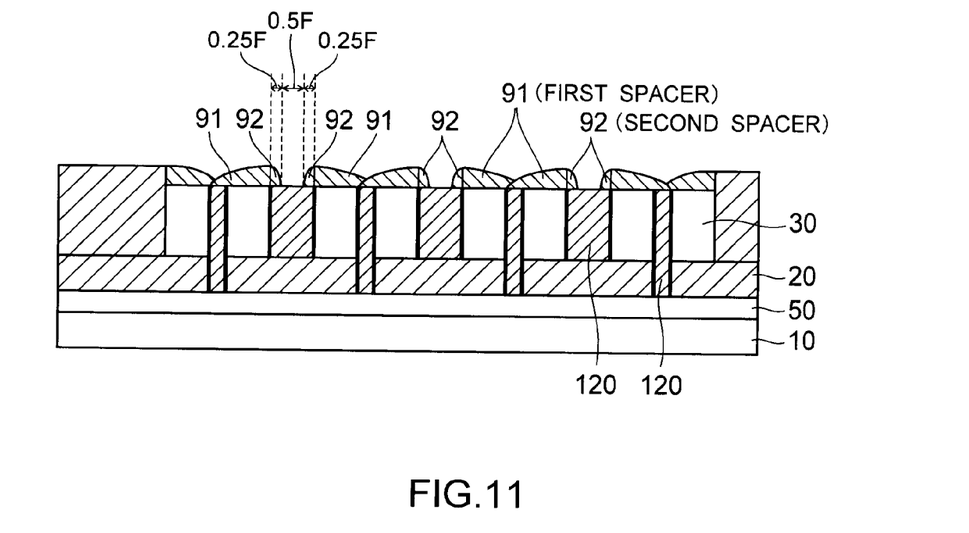
FIG. 11 is a cross-sectional view showing a manufacturing method following FIG. 10.

Next, a silicon nitride film having a thickness of 0.25 F is deposited and anisotropically etched by the RIE. As a result, second spacers 92 are formed on side surfaces of the first spacers 91 as shown in FIG. 11. The second spacers 92 are formed on the polysilicon 120 in the second trenches TR2. Furthermore, the deposited silicon nitride film also covers the polysilicon 120 in the first trenches TR1. A width of each of the second spacers 92 is about 0.25 F. Accordingly, a surface of the polysilicon 120 is exposed by a width of 0.5 F.

Figure 12:
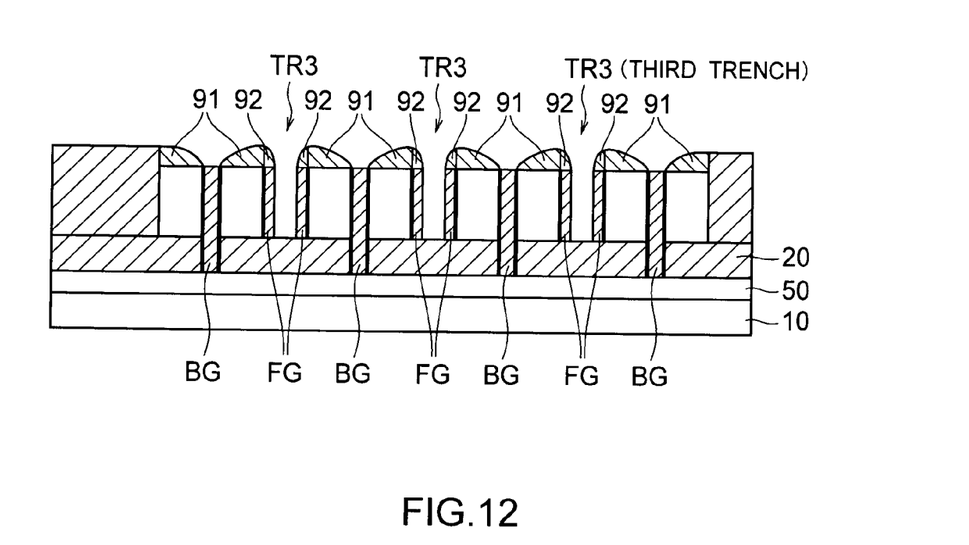
FIG. 12 is a cross-sectional view showing a manufacturing method following FIG. 11.

Next, as shown in FIG. 12, using the first spacers 91 and the second spacers 92 as a mask, the polysilicon 120 in the first trenches TR1 is etched by the RIE to reach an upper surface of the BOX layer 20. As a result, third trenches TR3 are formed in the polysilicon 120 in a self-aligned fashion. At this time, the front gate electrodes FGs each having a width of 0.25 F and the back gate electrodes BGs each having a width of 0.25 F are formed.

Figure 13:
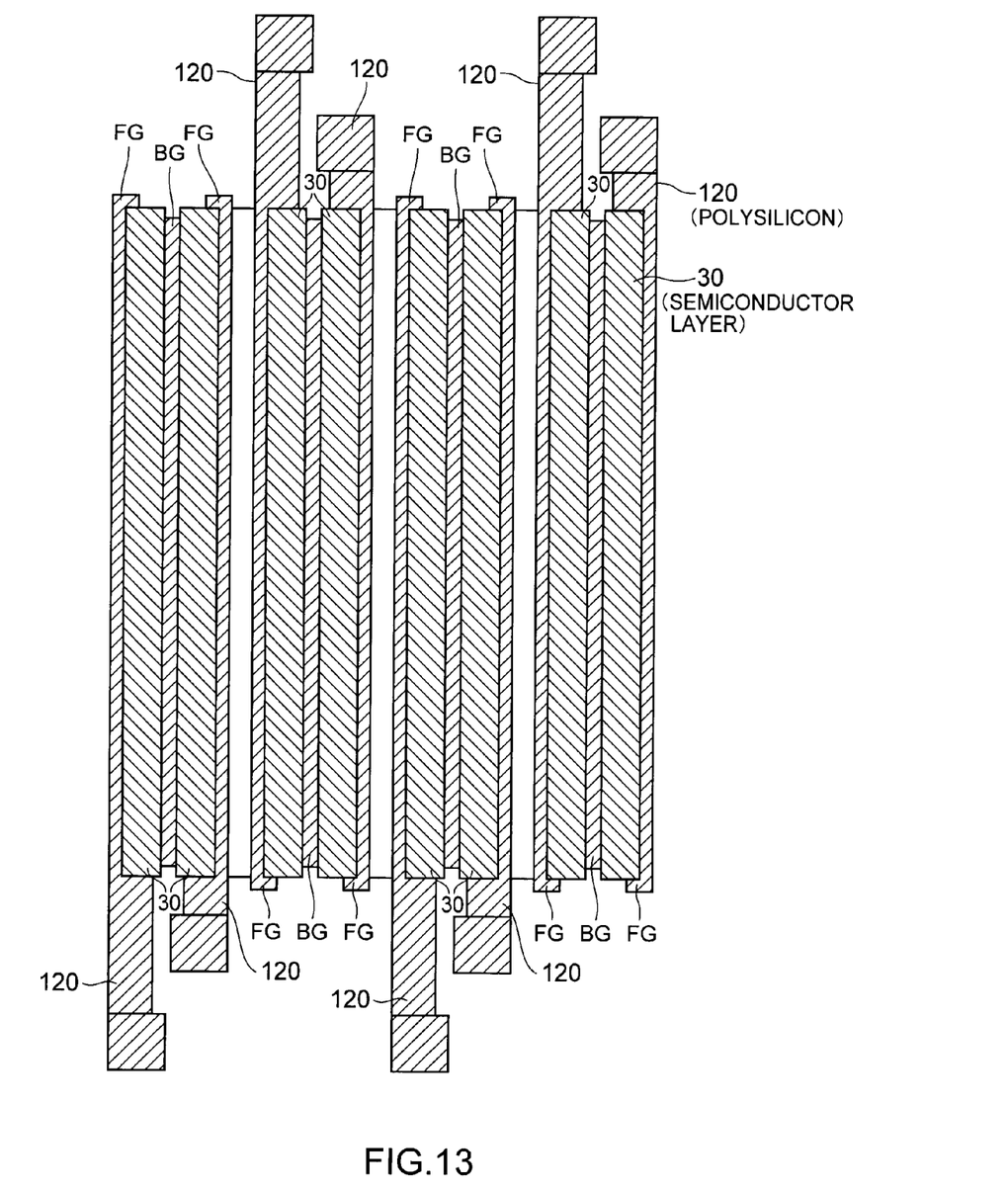
FIG. 13 is a plane view showing a manufacturing method following FIG. 12.
Figure 14:
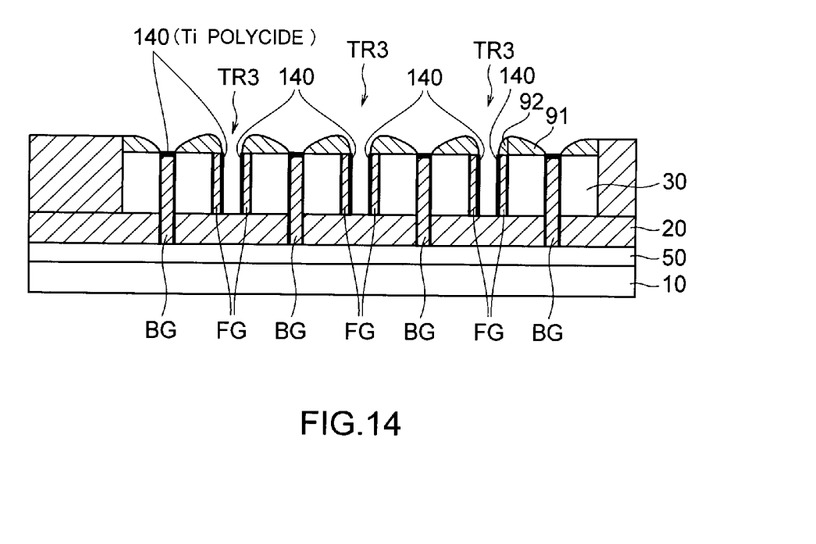
FIG. 14 is a cross-sectional view showing a manufacturing method following FIG. 13.

As shown in FIG. 13, the polysilicon 120 outside of the memory cell region is processed into wirings by the photolithography and the RIE. The front gate electrodes FGs are extended in its extension direction by the polysilicon 120, and connected to the front gate contacts FGCs. FIG. 13 is a plan view after working the polysilicon 120 to form the wirings. Thereafter, the impurities in the sources, the drains, and the impurity diffusion layer 50 are activated by annealing at high temperature equal to or higher than 1000° C.

After depositing a titanium film by about 20 nm, the titanium film is reacted with side surfaces of the front gate electrodes FGs by thermal treatment. As a result, titanium polycide 140 is formed on the respective side surfaces of the front gate electrodes FG. At the same time, the titanium polycide 140 is formed on side surfaces of the back gate electrodes GB. The titanium polycide 140 functions to reduce resistances of the front gate electrodes FG and the back gate electrode BG.

Figure 15:
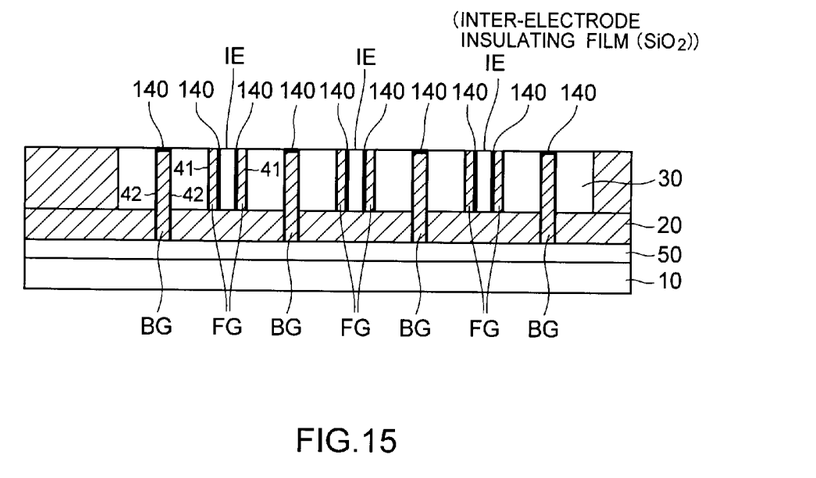
FIG. 15 is a cross-sectional view showing a manufacturing method following FIG. 14.

The first and second spacers (SiN) 91 and 92 are removed using a hot phosphoric acid solution. A silicon oxide film is deposited by a depth equal to or larger than 300 nm and etched back by the CMP or the like so as to expose upper surfaces of the front gate electrodes FGs. As shown in FIG. 15, the inter-electrode insulating films IE are formed in the third trenches TR3, respectively.

Figure 16:
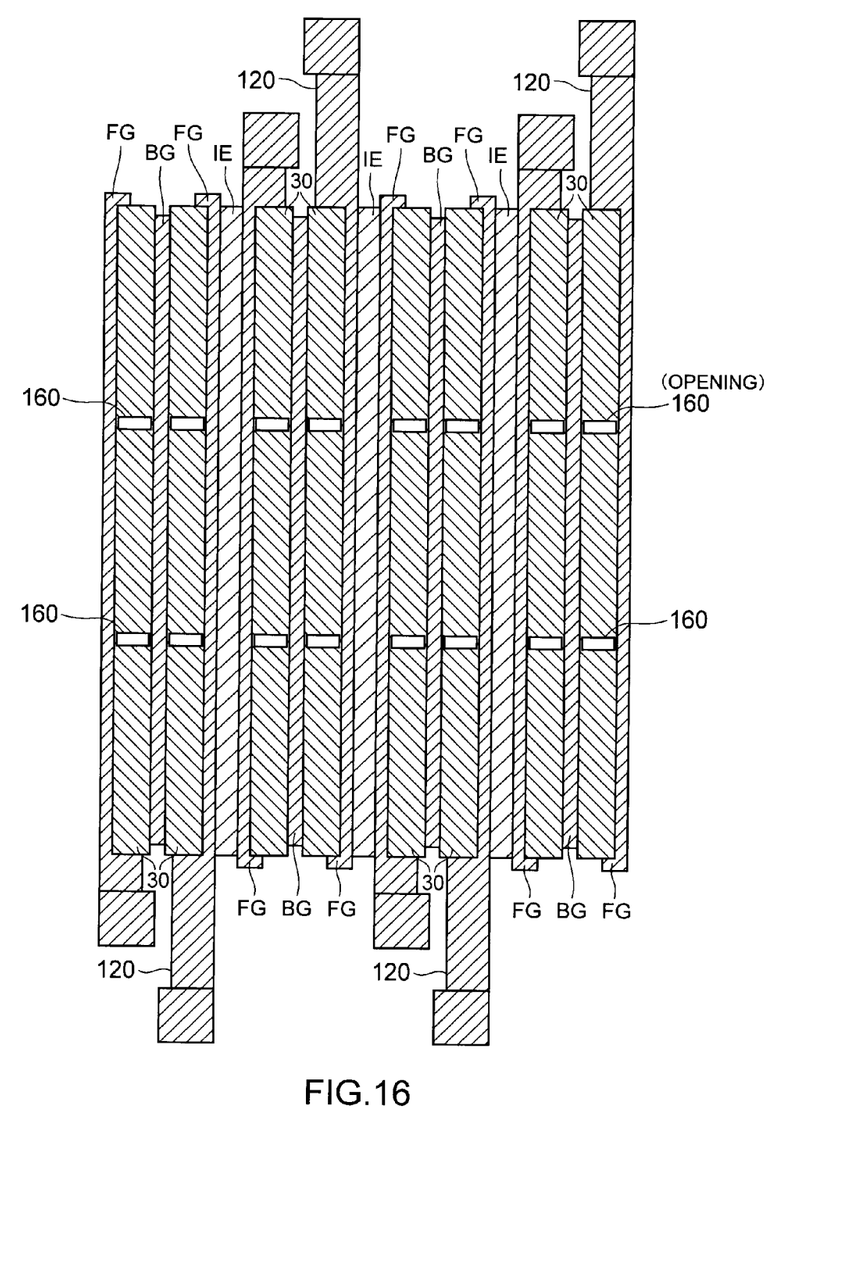
FIG. 16 is a plane view showing a manufacturing method following FIG. 15.
Figure 17:
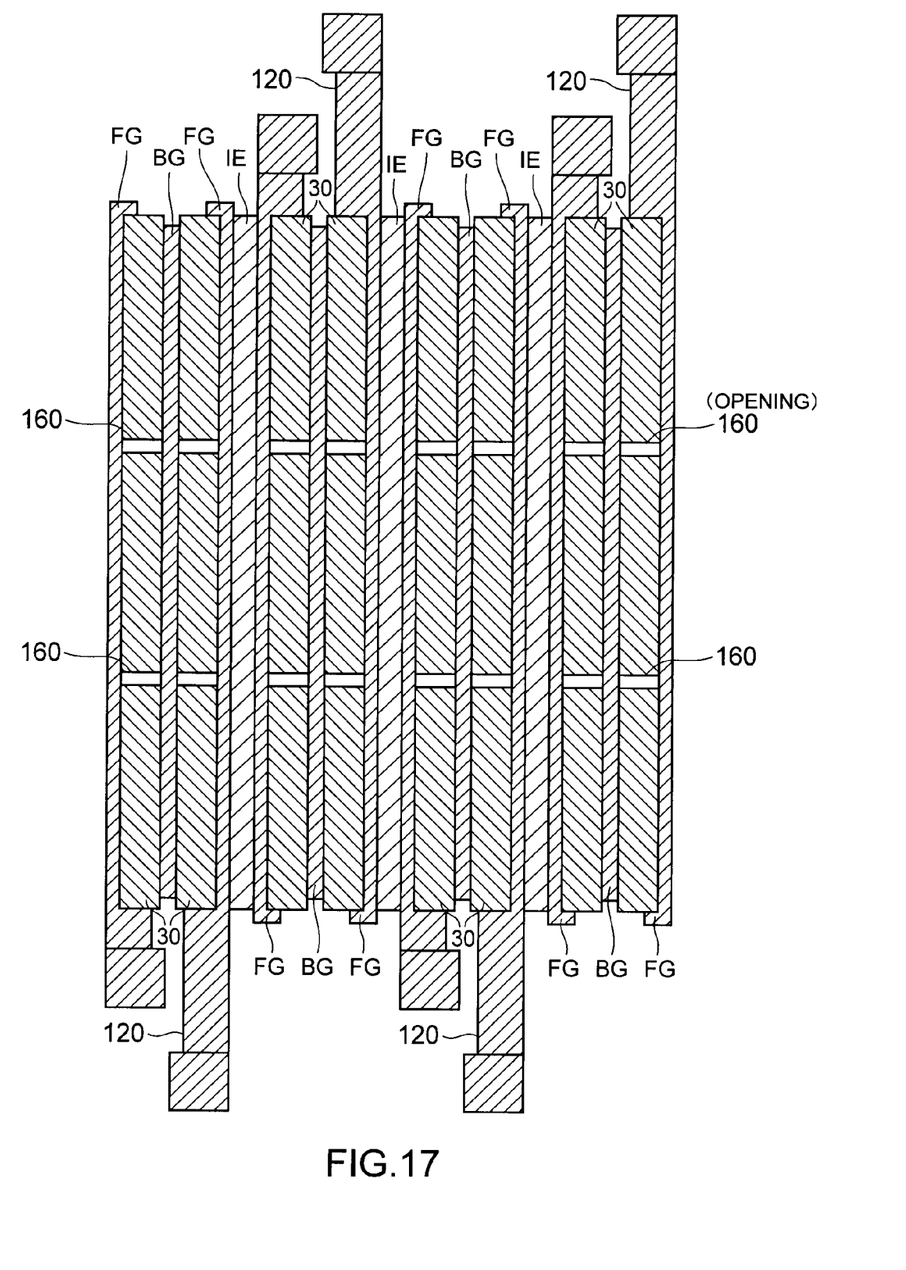
FIG. 17 is a plane view showing a manufacturing method following FIG. 16.

As shown in FIG. 16, openings 160 are formed in the respective element isolation areas IA in the semiconductor layers 30 by the photolithography and the RIE. The openings 160 are formed to be narrower than the semiconductor layers 30. The openings 160 are etched to reach the front gate electrodes FG and the back gate electrodes BG by the CDE. As a result, as shown in FIG. 17, the semiconductor layers 30 in the element isolation areas IAs can be etched without chipping the front gate electrodes FG and the back gate electrodes BG. Next, a silicon oxide film is deposited by about 300 nm. This silicon oxide film is etched back by the CMP or the like, thereby forming the STIs between the adjacent bit line contact BLC, respectively.

Referring back to FIGS. 1 and 2, after depositing an interlayer insulating film IL, the source line contacts SLCs, the bit line contacts BLCs (not shown in FIG. 2), and the back gate contacts BGC are formed. Furthermore, as shown in FIG. 1, the front gate contacts FGCs are formed on the wirings made of the polysilicon 120. Moreover, the source lines SLs, the bit lines BLs, the back gate lines BGLs, front gate lines FGL (not shown) are formed. In this manner, the Fin FBC memory device according to the first embodiment is completed.

According to the first embodiment, the back gate electrodes BGs, the front gate electrodes FGs, and the inter-electrode insulating films IEs can be all formed in self-aligned fashions. Due to this, widths of the back gate electrodes BGs, the front gate electrodes FGs, and the inter-electrode insulating films IEs in the extension direction of the bit lines BL are all smaller than F. In the first embodiment, the widths of each of the back gate electrodes BGs, each of the front gate electrodes FGs, and each of the inter-electrode insulating films IEs are 0.25 F, 0.25 F, and 0.5 F, respectively. A width of each semiconductor layer 30 is F. One back gate electrode BG and one inter-electrode insulating film IE are shared between two adjacent memory cells (FBCs). Accordingly, a width of one memory cell is 0.25 F/2+0.25 F+0.5 F/2+F=1.625 F.

A length of each drain in an extension direction of the front and back gate electrodes FGs and BGs is F, that of each floating body FB is F, that of each source is F, and that of each STI is F. One source and one STI are shared between adjacent memory cells (FBCs). Accordingly, a length of one FBC is F+F+F/2+F/2=3 F. Therefore, a size (an area) of one FBC is 1.65 F×3 F=4.875 $F^2$ as shown in FIG. 1.

Conventionally, widths of each back gate electrode BG and each front gate electrode FG are equal to or larger than F, respectively. Accordingly, a size (an area) of one FBC is equal to or larger than 3 F×3 F=9 $F^2$. Moreover, the presence of the silicon part that is not electrically activated between the two adjacent front gate electrodes FG obstructs downsizing of the semiconductor memory device.

According to the first embodiment, the inter-electrode insulating film IE in place of the silicon part is provided between the two adjacent front gate electrodes FGs. It is thereby possible to narrow the width between the two adjacent front gate electrodes FGs. In addition, the widths of each back gate electrode BG and each inter-electrode insulating film IE are smaller than F (0.25 F and 0.5 F), respectively. Accordingly, in the first embodiment, the size of one FBC can be downsized to 4.875 $F^2$ as stated. An area of the Fin FBC memory device according to the first embodiment is about 54% of that of the conventional Fin FBC memory device. In this manner, the first embodiment can realize downsizing of the memory region by making the width of each of the back gate electrodes BGs, the front gate electrodes FGs, and the inter-electrode insulating films IEs equal to or smaller than F.

In the first embodiment, the widths of each back gate electrode BG, each front gate electrodes FG, and each inter-electrode insulating film IE are equal to or smaller than F, respectively. Alternatively, any one of the back gate electrode BG, the front gate electrode FG, or the inter-electrode insulating film IE may be formed to have a width smaller than F. In this case, the degree of downsizing the memory region is reduced, however, the advantage that the area of each FBC can be made smaller than 9 $F^2$ can be maintained.

Second Embodiment

Figure 18:
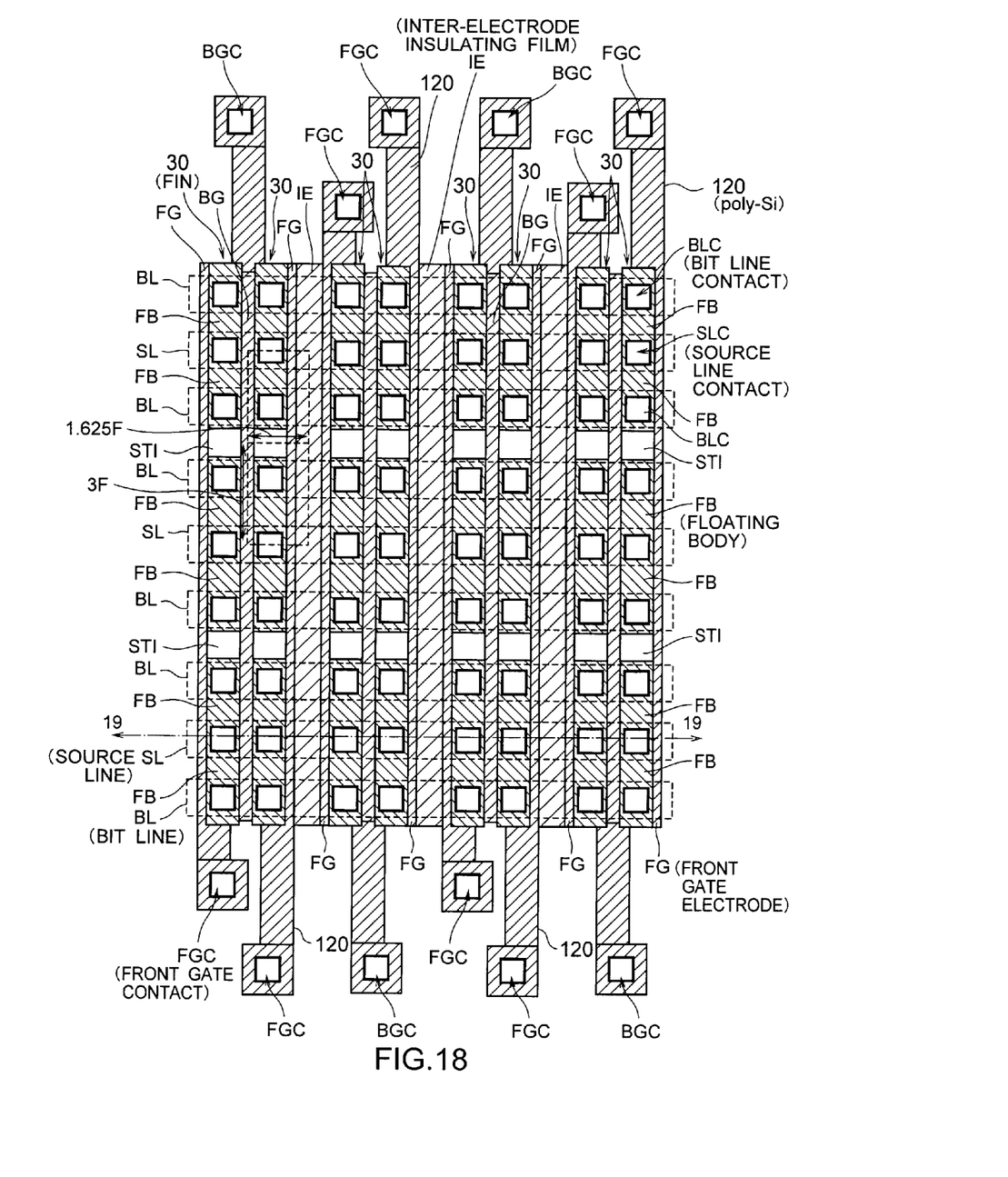
FIG. 18 is a schematic plan view of a Fin FBC memory device according to a second embodiment of the present invention.

FIG. 18 is a schematic plan view of a Fin FBC memory device according to a second embodiment of the present invention. In the second embodiment, back gate electrodes BGs are not connected to the silicon substrate 10 but provided on the BOX layer 20. Accordingly, the back gate electrodes BGs are extended in the extension direction of the back electrodes BGs by the polysilicon 120, and connected to the back gate contacts BGCs formed on the same layer as that on which the front gate contacts FGCs are formed.

Figure 19:
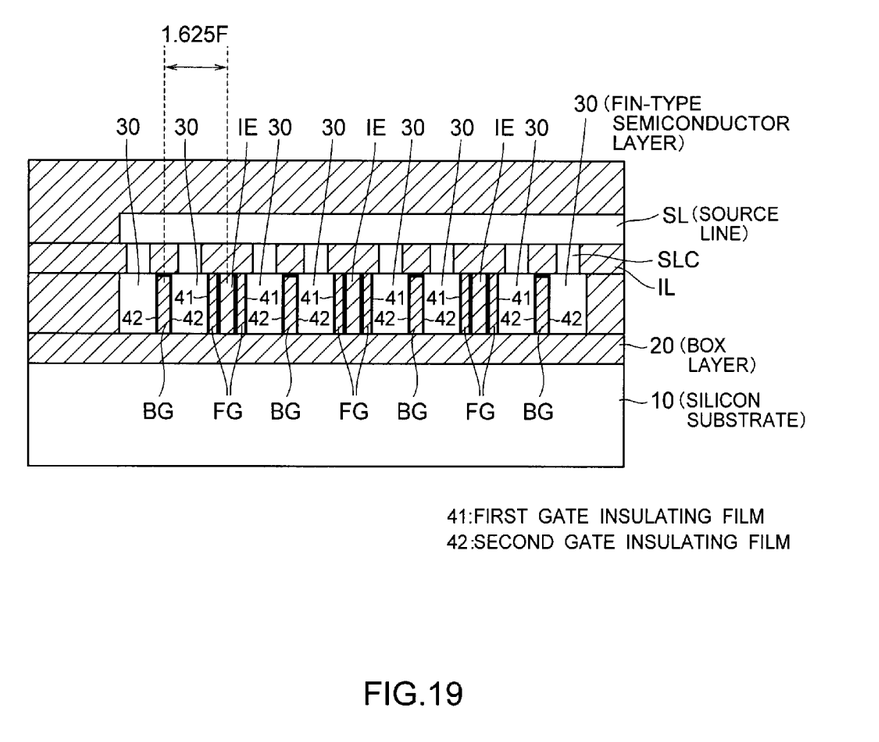
FIG. 19 is a cross-sectional view taken along a line 19-19 of FIG. 18.

FIG. 19 is a cross-sectional view taken along a line 19-19 of FIG. 18. The back gate electrodes BGs do not penetrate the BOX layer 20 but are provided on the BOX layer 20. The remaining configuration of the Fin FBC memory device according to the second embodiment may be identical to that of the Fin FBC memory device according to the first embodiment.

Differences of a method of manufacturing the Fin FBC memory device according to the second embodiment from that according to the first embodiment will be described. In the method of manufacturing the Fin FBC memory device according to the second embodiment, etching of the semiconductor layer 30 is stopped on the upper surface of the BOX layer 20 at the step of forming the second trenches TR2 shown in FIG. 7.

At the step of working the polysilicon 120 shown in FIG. 13, the polysilicon 120 outside of the memory cell region is processed into wirings not only for the front gate electrodes FBs but also for the back gate electrodes BGs. By doing so, both the front gate electrodes FBs and the back gate electrodes BGs are extended in their respective extension directions by the polysilicon 120. The other steps of manufacturing the Fin FBC memory device according to the second embodiment are identical to those of manufacturing the Fin FBC memory device according to the first embodiment.

In the second embodiment, there is no need to form the second trenches TR2 as deep as to reach the silicon substrate 10. In the second embodiment, there is no need to form the back gate contacts BGC as deep as to reach the silicon substrate 10. Furthermore, there is no need to form the impurity diffusion layer 50. Therefore, it is relatively easy to manufacture the Fin FBC memory device according to the second embodiment. Further, the second embodiment can achieve the same effects as those of the first embodiment.

The invention claimed is:

1. A semiconductor memory device comprising:
    a semiconductor substrate;
    an insulation layer provided on the semiconductor substrate;
    a plurality of Fin-type semiconductor layers provided on the insulation layer, the Fin-type semiconductor layers including source regions, drain regions, and floating body regions in an electrically floating state provided between the source regions and the drain regions;
    first gate insulation films provided on first side surfaces of the Fin-type semiconductor layers;
    second gate insulation films provided on second side surfaces of the Fin-type semiconductor layers, the second side surfaces being opposite sides of the first side surfaces of the Fin-type semiconductor layers;
    front gate electrodes provided on the first side surfaces via the first gate insulation films; and
    back gate electrodes provided between a second side surface of one of the Fin-type semiconductor layers and a second side surface of the other Fin-type semiconductor layer which is adjacent to the one of the Fin-type semiconductor layers, the second side surface of the one of the Fin-type semiconductor layers and the second side surface of the other Fin-type semiconductor layer are opposed to each other, wherein
    when a smallest line width which can be formed by lithography is F, widths of the front gate electrodes or widths of the back gate electrodes are smaller than the F in a cross section perpendicular to an extension direction of the Fin-type semiconductor layers.

2. The semiconductor memory device according to claim 1, further comprising:
    a diffusion layer provided on the semiconductor substrate; and
    back gate contacts provided outside of a memory formation region in which a plurality of memory cells including the floating body regions, the source regions and drain regions are formed, the back gate contact being connected to the diffusion layer, wherein
    the back gate electrodes are connected to the diffusion layer by penetrating the insulation layer, and connected to the back gate contacts via the diffusion layer.

3. The semiconductor memory device according to claim 1, further comprising an inter-electrode insulation film provided between a front gate electrode on a first side surface of one of the Fin-type semiconductor layers and a front gate electrode on a first side surface of the other Fin-type semiconductor layer which is adjacent to the one of the Fin-type semiconductor layers, the first side surface of the one of the Fin-type semiconductor layers and the first side surface of the other Fin-type semiconductor layer are opposed to each other, wherein
    a width of the inter-electrode insulation film is smaller than the F in the extension direction of the Fin-type semiconductor layers.

4. The semiconductor memory device according to claim 2, further comprising an inter-electrode insulation film provided between a front gate electrode on a first side surface of one of the Fin-type semiconductor layers and a front gate electrode on a first side surface of the other Fin-type semiconductor layer which is adjacent to the one of the Fin-type semiconductor layers, the first side surface of the one of the Fin-type semiconductor layers and the first side surface of the other Fin-type semiconductor layer are opposed to each other, wherein
a width of the inter-electrode insulation film is smaller than the F in the extension direction of the Fin-type semiconductor layers.

5. The semiconductor memory device according to claim 1, wherein
widths of the front gate electrodes and a width of the back gate electrodes are smaller than the F in a cross section perpendicular to an extension direction of the Fin-type semiconductor layers.

6. The semiconductor memory device according to claim 2, wherein
widths of the front gate electrodes and a width of the back gate electrodes are smaller than the F in a cross section perpendicular to an extension direction of the Fin-type semiconductor layers.

7. The semiconductor memory device according to claim 1, wherein
the front gate electrodes are extended to one side in the extension direction of the Fin-type semiconductor layers, and connected to front gate contacts formed outside of a memory formation region in which a plurality of memory cells including the floating body regions, the source regions and the drain regions are formed, and
the back gate electrodes are extended to other side in the extension direction of the Fin-type semiconductor layers, and connected to back gate contacts provided outside of the memory formation region.

* * * * *